(12) United States Patent
Wang

(10) Patent No.: US 10,966,353 B2
(45) Date of Patent: Mar. 30, 2021

(54) CENTRALIZED COOLING SYSTEM FOR DATA CENTER

(71) Applicant: GUANGDONG HI-1 NEW MATERIALS TECHNOLOGY RESEARCH INSTITUTE CO., LTD., Guangdong (CN)

(72) Inventor: Wei Wang, Guangdong (CN)

(73) Assignee: GUANGDONG HI-1 NEW MATERIALS TECHNOLOGY RESEARCH INSTITUTE CO., LTD., Guangzhou (CN)

( * ) Notice: Subject to any disclaimer, the term of this patent is extended or adjusted under 35 U.S.C. 154(b) by 182 days.

(21) Appl. No.: 16/345,240

(22) PCT Filed: Feb. 23, 2017

(86) PCT No.: PCT/CN2017/074518
§ 371 (c)(1),
(2) Date: Apr. 25, 2019

(87) PCT Pub. No.: WO2018/076581
PCT Pub. Date: May 3, 2018

(65) Prior Publication Data
US 2019/0281731 A1     Sep. 12, 2019

(30) Foreign Application Priority Data
Oct. 31, 2016   (CN) .......................... 201610930904.3

(51) Int. Cl.
H05K 7/20        (2006.01)
H05K 5/06        (2006.01)
(52) U.S. Cl.
CPC .......... H05K 7/20781 (2013.01); H05K 5/06 (2013.01); H05K 7/20163 (2013.01);
(Continued)

(58) Field of Classification Search
CPC .. H05K 7/20781; H05K 5/06; H05K 7/20163; H05K 7/20272; H05K 7/20736;
(Continued)

(56) References Cited

U.S. PATENT DOCUMENTS 4,149,134 A * 4/1979 Kothmann ......... H05K 7/20345
336/57
5,220,804 A * 6/1993 Tilton ...................... B64G 1/50
257/E23.088
(Continued)

FOREIGN PATENT DOCUMENTS

CN         203279429 U       11/2013
CN         206196221 U       5/2017

*Primary Examiner* — Binh B Tran
*Assistant Examiner* — Michael A Matey

(57) ABSTRACT

A centralized cooling system for data center comprises at least one cabinet, a spray hydraulic device and a hydraulic working substance cooling equipment integrated outside the cabinet, and an outer liquid working substance tank, which are connected by a pipe, wherein the cabinet comprises an auxiliary cabinet, a server cabinet, a liquid inlet pipe, and a return pipe; wherein an inner liquid working substance tank, a main pipe and a pipe distributor are arranged inside the auxiliary cabinet; a server and a plurality of spraying mechanisms are arranged inside the server cabinet; the liquid working substance sprayed from the spraying mechanisms is returned to the outer liquid working substance tank through the return pipe, cooled down by means of the spray hydraulic device and the hydraulic circulating cooling device, and enters the inner liquid working substance tank, and the liquid working substance has no phase transition during the spraying process.

10 Claims, 4 Drawing Sheets

(52) U.S. Cl.
CPC ..... *H05K 7/20272* (2013.01); *H05K 7/20736* (2013.01); *H05K 7/20763* (2013.01)

(58) Field of Classification Search
CPC ........... H05K 7/20763; H05K 7/20345; H05K 7/20809; H05K 7/20327; H05K 7/20772; H05K 7/20818; H05K 7/2039; H05K 7/2079; H05K 7/20281; H01L 23/4735; F25D 21/10
See application file for complete search history.

(56) References Cited

U.S. PATENT DOCUMENTS

| | | | | |
|---|---|---|---|---|
| 5,522,452 A * | 6/1996 | Mizuno | ................. | H01L 23/427 165/104.33 |
| 5,907,473 A * | 5/1999 | Przilas | ............... | H05K 7/20345 361/699 |
| 5,943,211 A * | 8/1999 | Havey | ................... | H01L 23/427 165/80.4 |
| 6,205,799 B1 * | 3/2001 | Patel | ...................... | F25B 39/04 165/104.33 |
| 6,955,062 B2 * | 10/2005 | Tilton | ...................... | F28D 5/00 257/E23.1 |
| 7,000,691 B1 * | 2/2006 | Weber | ................... | F25B 23/006 165/201 |
| 7,180,741 B1 * | 2/2007 | Knight | ............... | H05K 7/20345 165/80.4 |
| 7,405,935 B1 * | 7/2008 | Carey | ................ | H05K 7/20345 361/699 |
| 8,724,322 B2 * | 5/2014 | Rinke | ................ | H05K 7/20772 361/699 |
| 2004/0264124 A1 * | 12/2004 | Patel | ........................ | G06F 1/20 361/679.46 |
| 2006/0126296 A1 * | 6/2006 | Campbell | .......... | H05K 7/20781 361/700 |
| 2019/0293356 A1 * | 9/2019 | Tian | ..................... | F25B 39/022 |

* cited by examiner

CENTRALIZED COOLING SYSTEM FOR DATA CENTER

FIELD OF THE INVENTION

The present invention relates to the field of cabinet cooling technology, more particularly to a centralized cooling system for a data center.

BACKGROUND OF THE INVENTION

In order to meet the user's requirements for data processing, the scales of hardware facilities in data centers unceasingly expand along with the incessant development of Internet, resulting in enormous energy consumption which becomes an unavoidable problem needs to be solved for the development of data centers. Meanwhile, data center cooling issues are becoming increasingly important. Since conventional natural cooling cannot meet cooling requirements of existing data centers, usually both the air conditioning units cooling and the water cooling are applied for the data center cooling. However, in such case, the energy consumption of cooling equipment that is used accounts for 30% of the total energy consumption of the data centers, which means too much energy is consumed.

According to Moore's law, as the density of associated computer chips increases, the density of cooling loads of data centers increases exponentially. In particular, the energy required for the cooling of data centers is at least 10 times greater than that of common offices under the condition of equal areas. Thus, the cooling performed by non-central air conditioning units which are usually simply used in existing technologies, not only cannot effectively distribute the cold air to various equipments evenly, but also increases energy consumption due to the lack of precise control for air conditioning. Besides, the integral central air conditioning significantly increases construction costs, which is not well adapted to practical usage either.

Furthermore, since water resource is in short supply all the time and saving water is necessary, the water cooling which will consume a certain amount of water cannot be widely used, especially in the regions short of water. Furthermore, the cooling tower, which has a risk of freezing at low temperatures, is not suitable for cold regions. Moreover, the water cooling is further limited due to high cost.

Hence, in order to meet the requirements of energy-saving and cost-reducing for data centers, it is necessary to provide an improved solution.

SUMMARY OF THE INVENTION

In order to solve existing problems, the present invention provides a centralized heat-exchange cooling system for a data center, which can realize separated spray cooling for the data server cabinet and centralized cooling for the heat transferring medium. In such system, the liquid working substance is used for the spray cooling of the heating element of the server cabinet. Since the specific heat capacity of the liquid working substance is higher than that of the air, the cooling performance can be significantly improved. Such system performs the secondary cooling of the medium in a centralized cooling manner, which facilitates the arrangement design for the individually server cabinet and the overall arrangement for the data center.

In particular, the present invention provides a solution as follows.

A centralized cooling system for a data center, which comprises at least one cabinet, a spray hydraulic device and a hydraulic working substance cooling equipment which are integrated outside the cabinet, and an outer liquid working substance tank, wherein the spray hydraulic device, the hydraulic working substance cooling equipment, the outer liquid working substance tank and the cabinet are connected by a pipe;

The cabinet comprises an auxiliary cabinet, a server cabinet, liquid inlet pipes, and return pipes;

An inner liquid working substance tank, a main pipe and a pipe distributor are arranged inside the auxiliary cabinet, wherein the pipe distributor is in communication with the inner liquid working substance tank by the main pipe, and both the outer liquid working substance tank and the inner liquid working substance tank contain insulative and thermally-conductive liquid working substance;

A server and a plurality of spraying mechanisms are arranged inside the server cabinet, and the spraying mechanisms are disposed directly facing a heat source of the server;

The spraying mechanisms are connected to the pipe distributor by the liquid inlet pipes, the liquid working substance sprayed from the spraying mechanisms can be returned to the outer liquid working substance tank through the return pipes, and then can be cooled down by means of the spray hydraulic device and the hydraulic working substance cooling equipment, and after that can enter the inner liquid working substance tank of the auxiliary cabinet, wherein the liquid working substance has no phase transition during the spraying process.

Preferably, a first liquid working substance pump is further arranged inside the auxiliary cabinet, and the first liquid working substance pump is in communication with the pipe distributor.

Preferably, the auxiliary cabinet is arranged with a first liquid working substance filter, and the first liquid working substance filter is arranged in the inner liquid working substance tank and is in communication with a liquid inlet of the first liquid working substance pump.

Preferably, the hydraulic working substance cooling equipment preferably may be an air-cooling device, and the air-cooling device includes a heat sink and a fan.

Preferably, the spray hydraulic device comprises a second working substance filter and a second liquid working substance pump, wherein the second liquid working substance filter is arranged in the outer liquid working substance tank, and the second liquid working substance filter is in communication with a liquid inlet of the second liquid working substance pump.

Preferably, the plurality of spraying mechanisms and the heat source of the server are transversely arranged in parallel to each other with a gap, and the spraying mechanisms are spraying boxes.

Preferably, the spraying mechanisms are configured such that the liquid working substance sprayed to the heat source is like rainwater.

Preferably, the spraying mechanisms are configured such that the liquid working substance sprayed to the heat source is like mist.

Preferably, the liquid working substance is mineral oil.

Preferably, the server cabinet has a fully sealed structure.

The present invention has advantages as follows.

(1) The present invention provides functional divisions for the cabinet and divides the cabinet into the server cabinet and the auxiliary cabinet. Since the initial structures of the server and the cabinet are not changed too much, the system can be easily integrated and is easy to produce.

(2) In the present invention, the spray hydraulic device and the hydraulic working substance cooling equipment are integrated outside the cabinet in a multi-split type such that it can be installed outside the machine room to supply the liquid working substance to at least one cabinet so as to perform cooling, which is easy to manufacture in engineering.

(3) In the present invention, the liquid working substance can be directly sprayed onto the surface of the heating element of the server, whereby the intermediate thermal resistance can be greatly reduced, the heat-transfer performance can be improved, and the energy consumption of the system can be decreased.

(4) The present invention uses a centralized cooling method with spraying medium and abandons the fans which are usually used inside the machine room, which can obviously reduce the room noise and improve the user experience.

BRIEF DESCRIPTION OF THE DRAWINGS

In order to explain the embodiments of the present invention or existing solutions more clearly, the drawings used for description are briefly described below. It is apparent that the drawings described below merely illustrate some embodiments of the present invention. Based on these drawings, those skilled in the art may obtain some other drawings without any creative work.

Figure 1:
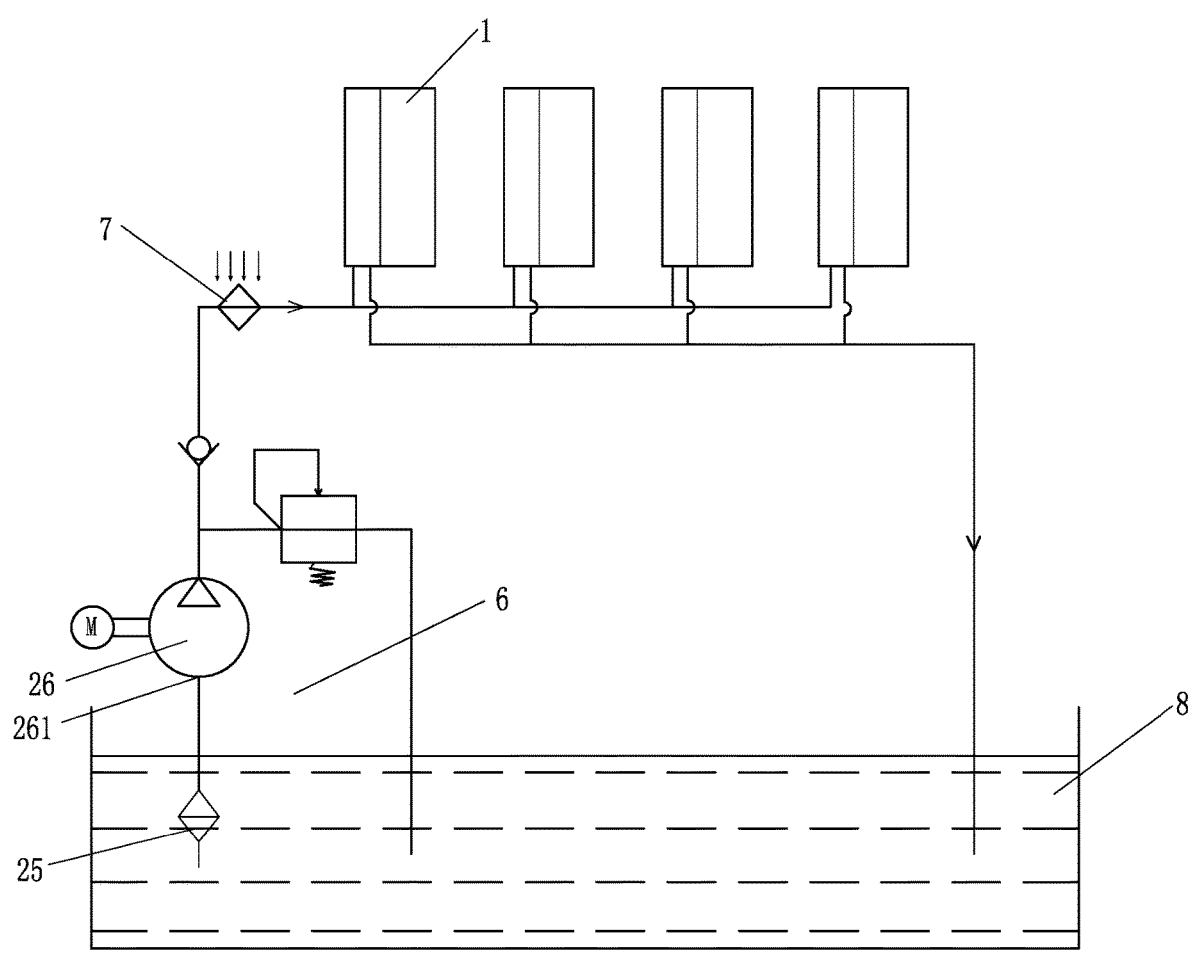
FIG. 1 is a schematic drawing of a centralized cooling system for a data center according to the present invention.

In the drawings: 1. cabinet; 2. auxiliary cabinet; 21. inner liquid working substance tank; 22. pipe distributor; 23. first liquid working substance pump; 231. liquid inlet of the first liquid working substance pump; 24. first liquid working substance filter; 25. second liquid working substance filter; 26. second liquid working substance pump; 261. liquid inlet of the second liquid working substance pump; 3. server cabinet; 31. server; 311. heat source; 32. spraying mechanisms; 4. liquid inlet pipes; 5. return pipes; 6. spray hydraulic device; 7. hydraulic working substance cooling equipment; 8. outer liquid working substance tank.

DETAILED DESCRIPTION OF ILLUSTRATED EMBODIMENTS

Embodiments of the present invention will be clearly and completely described in conjunction with the attached drawings. It is apparent that the embodiments described below are merely some, but not all, embodiments of the present invention. Based on the embodiments of the present invention, those skilled in the art may obtain other embodiments included within the scope of the present invention without any creative work.

Embodiment 1

Referring to FIG. 1, the present invention provides a centralized cooling system for a data center, which comprises at least one cabinet 1, a spray hydraulic device 6 and a hydraulic working substance cooling equipment 7 which are integrated outside the cabinet 1, and an outer liquid working substance tank 8, wherein the spray hydraulic device 6, the hydraulic working substance cooling equipment 7, the outer liquid working substance tank 8 and the cabinet 1 are connected by a pipe.

Figure 2:
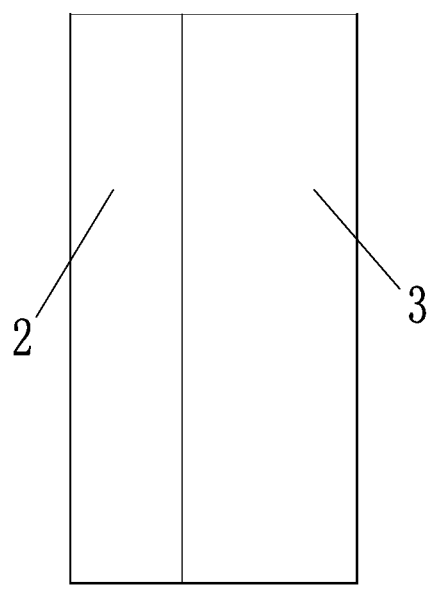
FIG. 2 is a schematic drawing of a cabinet according to the present invention.
Figure 3:
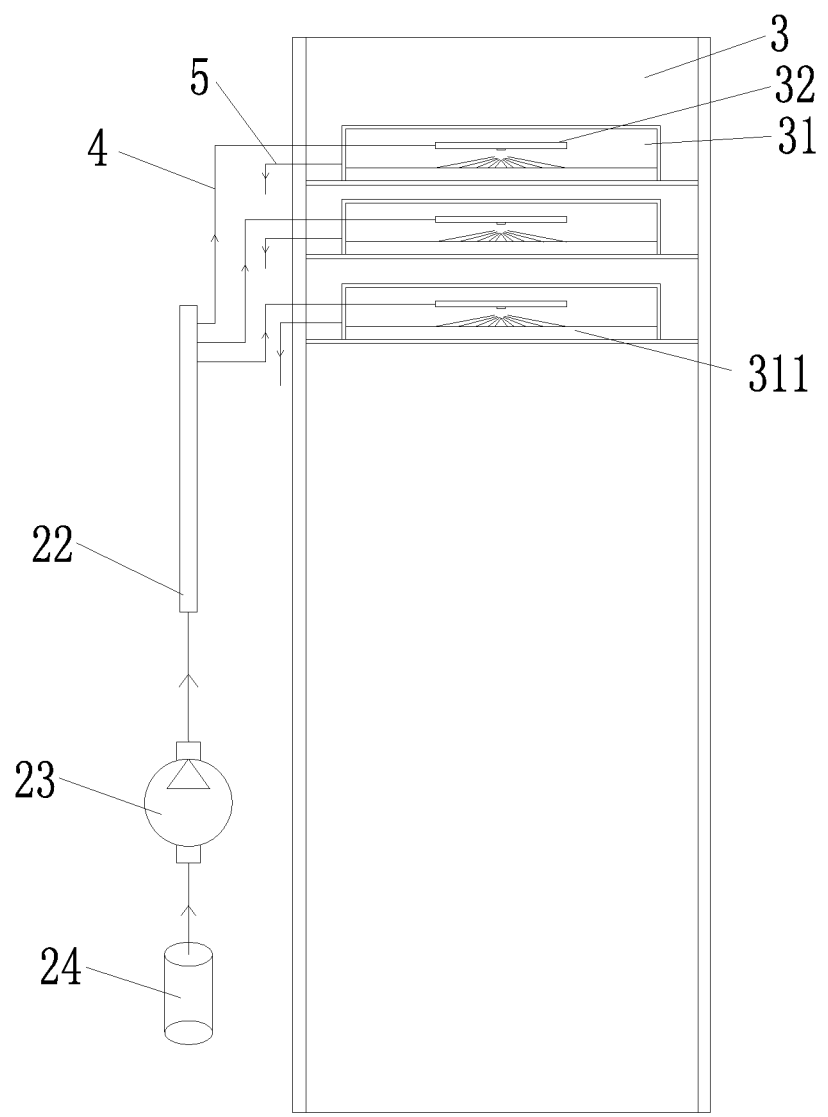
FIG. 3 is a schematic drawing of a server cabinet according to the present invention.

Referring to FIGS. 2 and 3, the cabinet 1 comprises an auxiliary cabinet 2, a server cabinet 3, liquid inlet pipes 4, and return pipes 5.

Figure 4:
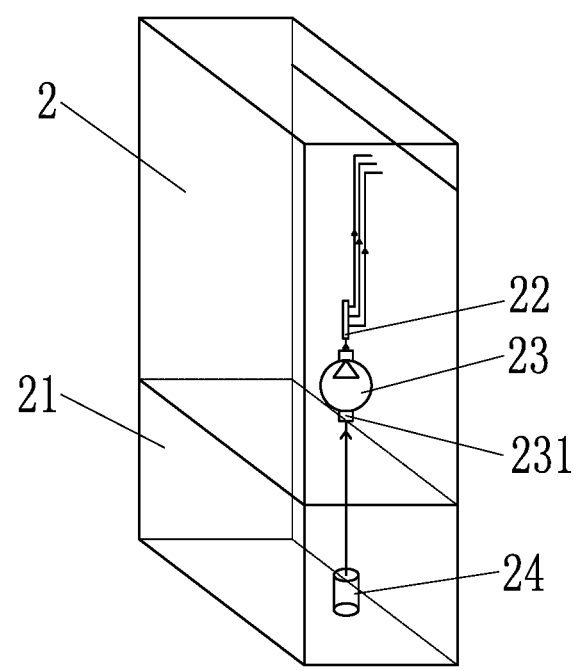
FIG. 4 is a schematic drawing of an auxiliary cabinet according to the present invention.

Referring to FIGS. 3 and 4, an inner liquid working substance tank 21, a main pipe and a pipe distributor 22 are arranged inside the auxiliary cabinet 2, wherein the pipe distributor 22 is in communication with the inner liquid working substance tank 21 by the main pipe, and both the outer liquid working substance tank 8 and the inner liquid working substance tank 21 contain insulative and thermally-conductive liquid working substance.

A server 31 and a plurality of spraying mechanisms 32 are arranged inside the server cabinet 3, and the spraying mechanisms 32 are disposed directly facing a heat source 311 of the server 31.

The spraying mechanisms 32 are connected to the pipe distributor 22 by the liquid inlet pipes 4, the liquid working substance sprayed from the spraying mechanisms 32 can be returned to the outer liquid working substance tank 8 through the return pipes 5, and then can be cooled down by means of the spray hydraulic device 6 and the hydraulic working substance cooling equipment 7, and after that can enter the inner liquid working substance tank 21 of the auxiliary cabinet 2. The liquid working substance has no phase transition during the spraying process.

Preferably, the spray hydraulic device 6 comprises a second working substance filter and a second liquid working substance pump 26, wherein the second liquid working substance filter 25 is arranged inside the outer liquid working substance tank 8, and the second liquid working substance filter 25 is in communication with a liquid inlet 261 of the second liquid working substance pump 26.

Preferably, the plurality of spraying mechanisms 32 and the heat source 311 of the server 31 are transversely arranged in parallel to each other with a gap, and the spraying mechanisms 32 are spraying boxes.

Preferably, the spraying mechanisms 32 are configured such that the liquid working substance sprayed to the heat source 311 is like rainwater.

Preferably, the liquid working substance is mineral oil.

Preferably, the server cabinet 3 has a fully sealed structure.

During operation, the liquid working substance stored in the inner liquid working substance tank 21 can be transmitted to the pipe distributor 22 through the main pipe, and then can be branched into several branches by means of the pipe distributor 22 and transmitted to the spraying mechanisms 32. The liquid working substance can be directly sprayed onto a circuit board of the server 31 by means of the spraying mechanisms 32, and the liquid working substance can be directly contacted with the heat source 311 of the server 31 so as to take heat away and cool the server 31 down. The liquid working substance which is heated and carries heat can be converged together and returned back into the outer liquid working substance tank 8 by means of the return pipes 5, and then can be cooled down by means of the spray hydraulic device 6 and the hydraulic working substance cooling equipment 7, and after that can enter the inner liquid working substance tank 21 of the auxiliary cabinet 2.

The present invention has advantages as follows.

(1) With the cabinet being divided into the server cabinet and the auxiliary cabinet, the present invention provides simple and clear functional divisions. Since the initial structure of the server cabinet is not changed too much, the system has simple integration and is convenient to produce.

(2) In the present invention, the spray hydraulic device and the hydraulic working substance cooling equipment are integrated outside the cabinet and particularly installed outside the machine room in a multi-split type so as to supply the liquid working substance to at least one cabinet to perform cooling, which is easy to manufacture in engineering.

(3) In the present invention, the liquid working substance can be directly sprayed onto the surface of the heating element of the server, whereby the intermediate thermal resistance can be greatly reduced, the heat-transfer performance can be improved, and the energy consumption of the system can be decreased.

(4) The present invention uses a centralized cooling method with spraying medium and abandons the fans which are usually used inside the machine room, which can obviously reduce the room noise and improve the user experience.

(5) Compared with conventional air-cooling cabinets, the server cabinet having a fully sealed structure can achieve better Ingress Protection Code and have increased dustproof and waterproof effects.

Embodiment 2

Referring to FIG. 1, the present invention provides a centralized cooling system for a data center, which comprises at least one cabinet 1, a spray hydraulic device 6 and a hydraulic working substance cooling equipment 7 which are integrated outside the cabinet 1, and an outer liquid working substance tank 8, wherein the spray hydraulic device 6, the hydraulic working substance cooling equipment 7, the outer liquid working substance tank 8 and the cabinet 1 are connected by a pipe.

Referring to FIGS. 2 and 3, the cabinet 1 comprises an auxiliary cabinet 2, a server cabinet 3, liquid inlet pipes 4, and return pipes 5.

Referring to FIGS. 3 and 4, an inner liquid working substance tank 21, a main pipe and a pipe distributor 22 are arranged inside the auxiliary cabinet 2, wherein the pipe distributor 22 is in communication with the inner liquid working substance tank 21 by the main pipe, and both the outer liquid working substance tank 8 and the inner liquid working substance tank 21 contain insulative and thermally-conductive liquid working substance.

A server 31 and a plurality of spraying mechanisms 32 are arranged inside the server cabinet 3, and the spraying mechanisms 32 are disposed directly facing a heat source 311 of the server 31.

The spraying mechanisms 32 are connected to the pipe distributor 22 by the liquid inlet pipes 4, the liquid working substance sprayed from the spraying mechanisms 32 can be returned to the outer liquid working substance tank 8 through the return pipes 5, and then can be cooled down by means of the spray hydraulic device 6 and the hydraulic working substance cooling equipment 7, and after that can enter the inner liquid working substance tank 21 of the auxiliary cabinet 2. The liquid working substance has no phase transition during the spraying process.

Preferably, a first liquid working substance pump 23 is further arranged inside the auxiliary cabinet 2, and the first liquid working substance pump 23 is in communication with the pipe distributor 22.

Preferably, the spray hydraulic device 6 comprises a second working substance filter and a second liquid working substance pump 26, wherein the second liquid working substance filter 25 is arranged inside the outer liquid working substance tank 8, and the second liquid working substance filter 25 is in communication with a liquid inlet 261 of the second liquid working substance pump 26.

Preferably, the plurality of spraying mechanisms 32 and the heat source 311 of the server 31 are transversely arranged in parallel to each other with a gap, and the spraying mechanisms 32 are spraying boxes.

Preferably, the spraying mechanisms 32 are configured such that the liquid working substance sprayed to the heat source 311 is like rainwater.

Preferably, the liquid working substance is mineral oil.

Preferably, the server cabinet 3 has a fully sealed structure.

During operation, the liquid working substance stored in the inner liquid working substance tank 21 is pressurized by the first liquid working substance pump 23, and then can be branched into several branches by means of the pipe distributor 22 and transmitted to the spraying mechanisms 32. The liquid working substance can be directly sprayed onto a circuit board of the server 31 by means of the spraying mechanisms 32, and the liquid working substance can be directly contacted with the heat source 311 of the server 31 so as to take heat away and cool the server 31 down. The liquid working substance which is heated and carries heat can be converged together and returned back into the outer liquid working substance tank 8 by means of the return pipes 5, and then can be cooled down by means of the spray hydraulic device 6 and the hydraulic working substance cooling equipment 7, and after that can enter the inner liquid working substance tank 21 of the auxiliary cabinet.

The difference of the present embodiment from Embodiment 1 is that, since the liquid working substance is pressurized by the first liquid working substance pump and then sprayed onto the circuit board by means of the spraying mechanisms 32, the spraying pressure is increased such that the liquid working substance can be contacted with the heat source 311 of the server more sufficiently per unit time, thereby improving cooling effect.

Embodiment 3

Referring to FIG. 1, the present invention provides a centralized cooling system for a data center, which comprises at least one cabinet 1, a spray hydraulic device 6 and a hydraulic working substance cooling equipment 7 which are integrated outside the cabinet 1, and an outer liquid working substance tank 8, wherein the spray hydraulic device 6, the hydraulic working substance cooling equipment 7, the outer liquid working substance tank 8 and the cabinet 1 are connected by a pipe.

Referring to FIGS. 2 and 3, the cabinet 1 comprises an auxiliary cabinet 2, a server cabinet 3, liquid inlet pipes 4, and return pipes 5.

Referring to FIGS. 3 and 4, a liquid working substance tank 21, a main pipe and a pipe distributor 22 are arranged inside the auxiliary cabinet 2, wherein the pipe distributor 22 is in communication with the inner liquid working substance tank 21 by the main pipe, and both the outer liquid working substance tank 8 and the inner liquid working substance tank 21 contain insulative and thermally-conductive liquid working substance.

A server 31 and a plurality of spraying mechanisms 32 are arranged inside the server cabinet 3, and the spraying mechanisms 32 are disposed directly facing a heat source 311 of the server 31.

The spraying mechanisms 32 are connected to the pipe distributor 22 by the liquid inlet pipes 4, the liquid working substance sprayed from the spraying mechanisms 32 can be returned to the outer liquid working substance tank 8 through the return pipes 5, and then can be cooled down by means of the spray hydraulic device 6 and the hydraulic working substance cooling equipment 7, and after that can enter the inner liquid working substance tank 21 of the auxiliary cabinet 2. The liquid working substance has no phase transition during the spraying process.

Preferably, a first liquid working substance pump 23 is further arranged inside the auxiliary cabinet 2, and the first liquid working substance pump 23 is in communication with the pipe distributor 22.

Preferably, the spray hydraulic device 6 comprises a second working substance filter and a second liquid working substance pump 26, wherein the second liquid working substance filter 25 is arranged inside the outer liquid working substance tank 8, and the second liquid working substance filter 25 is in communication with a liquid inlet 261 of the second liquid working substance pump 26.

Preferably, the auxiliary cabinet 2 is arranged with a first liquid working substance filter 24, and the first liquid working substance filter 24 is arranged in the inner liquid working substance tank 21 and is in communication with a liquid inlet 231 of the first liquid working substance pump 23.

Preferably, the plurality of spraying mechanisms 32 and the heat source 311 of the server 31 are transversely arranged in parallel to each other with a gap, and the spraying mechanisms 32 are spraying boxes.

Preferably, the spraying mechanisms 32 are configured such that the liquid working substance sprayed to the heat source 311 is like mist.

Preferably, the liquid working substance is mineral oil.

Preferably, the server cabinet 3 has a fully sealed structure.

During operation, the liquid working substance stored in the inner liquid working substance tank 21 flows through the first liquid working substance filter 24 into the first liquid working substance pump 23 and is pressurized by the first liquid working substance pump 23, and then can be branched into several branches by means of the pipe distributor 22 and transmitted to the spraying mechanisms 32. The liquid working substance can be directly sprayed onto a circuit board of the server 31 by means of the spraying mechanisms 32, and the liquid working substance can be directly contacted with the heat source 311 of the server 31 so as to take heat away and cool the server 31 down. The liquid working substance which is heated and carries heat can be converged together and returned back into the liquid working substance tank 8 by means of the return pipes 5, and then can be cooled down by means of the spray hydraulic device 6 and the hydraulic working substance cooling equipment 7, and after that can enter the inner liquid working substance tank 21 of the auxiliary cabinet.

The difference of the present embodiment from Embodiment 2 is that, the auxiliary cabinet is further arranged with the first liquid working substance filter for maintaining cleanliness of the liquid working substance, and the liquid working substance sprayed to the heat source by means of the spraying mechanisms is like mist, such that the liquid working substance can be contacted with the heat source of the server more sufficiently, thereby improving cooling effect.

All the above are merely some preferred embodiments of the present invention. It should be noted that, those skilled in the art may obtain modifications and equivalent arrangements included within the scope of the present invention without departing from the principle of the present invention.

The invention claimed is:

1. A centralized cooling system for a data center, characterized in that, it comprises at least one cabinet, a spray hydraulic device and a hydraulic working substance cooling equipment which are integrated outside the cabinet, and an outer liquid working substance tank, wherein the spray hydraulic device, the hydraulic working substance cooling equipment, the outer liquid working substance tank and the cabinet are connected by a pipe, wherein the cabinet comprises an auxiliary cabinet, a server cabinet, a liquid inlet pipe, and a return pipe;

wherein an inner liquid working substance tank, a main pipe and a pipe distributor are arranged inside the auxiliary cabinet, wherein the pipe distributor is in communication with the inner liquid working substance tank by the main pipe, and both the outer liquid working substance tank and the inner liquid working substance tank are loaded with insulative and thermally-conductive liquid working substance;

wherein a server and a plurality of spraying mechanisms are arranged inside the server cabinet, and the spraying mechanisms are disposed directly facing a heat source of the server;

wherein the spraying mechanisms are connected to the pipe distributor by the liquid inlet pipe, the liquid working substance sprayed from the spraying mechanisms is returned to the outer liquid working substance tank through the return pipe, and is cooled down by means of the spray hydraulic device and the hydraulic working substance cooling equipment, and enters the inner liquid working substance tank of the auxiliary cabinet, wherein the liquid working substance has no phase transition during the spraying process.

2. The centralized cooling system for the data center according to claim 1, characterized in that, a first liquid working substance pump is further arranged inside the auxiliary cabinet, and the first liquid working substance pump is in communication with the pipe distributor.

3. The centralized cooling system for the data center according to claim 2, characterized in that, the auxiliary cabinet is further arranged with a first liquid working substance filter, and the first liquid working substance filter is arranged in the inner liquid working substance tank and is in communication with a liquid inlet of the first liquid working substance pump.

4. The centralized cooling system for the data center according to claim 1, characterized in that, the hydraulic working substance cooling equipment is preferably an air-cooling device, and the air-cooling device includes a heat sink and a fan.

5. The centralized cooling system for the data center according to claim 1, wherein the spray hydraulic device comprises a second working substance filter and a second liquid working substance pump, wherein the second liquid working substance filter is arranged in the outer liquid working substance tank, and the second liquid working substance filter is in communication with a liquid inlet of the second liquid working substance pump.

6. The centralized cooling system for the data center according to claim 1, characterized in that, the plurality of spraying mechanisms and the heat source of the server are transversely arranged in parallel to each other with a gap, and the spraying mechanisms are spraying boxes.

7. The centralized cooling system for the data center according to claim 6, characterized in that, the spraying mechanisms are configured such that the liquid working substance sprayed to the heat source has a shape of rainwater.

8. The centralized cooling system for the data center according to claim 6, characterized in that, the spraying mechanisms are configured such that the liquid working substance sprayed to the heat source has a shape of mist.

9. The centralized cooling system for the data center according to claim 1, characterized in that, the liquid working substance is mineral oil.

10. The centralized cooling system for the data center according to claim 1, characterized in that, the server cabinet has a fully sealed structure.

* * * * *